US006396339B1

(12) United States Patent
Jacobs

(10) Patent No.: US 6,396,339 B1
(45) Date of Patent: May 28, 2002

(54) OPERATIONAL AMPLIFIER TRIM METHOD WITH PROCESS AND TEMPERATURE ERROR COMPENSATION

(75) Inventor: Karl H. Jacobs, Torrington, CT (US)

(73) Assignee: Texas Instruments Incorporated, Dallas, TX (US)

( * ) Notice: Subject to any disclaimer, the term of this patent is extended or adjusted under 35 U.S.C. 154(b) by 34 days.

(21) Appl. No.: 09/605,932

(22) Filed: Jun. 28, 2000

(51) Int. Cl.[7] ................................................. H03F 3/45
(52) U.S. Cl. ........................................... 330/9; 330/256
(58) Field of Search ................................ 330/252, 253, 330/256, 257, 289, 9; 327/307

(56) References Cited

U.S. PATENT DOCUMENTS

| 5,386,160 | A | | 1/1995 | Archer et al. ................ 327/513 |
| 6,194,962 | B1 | * | 2/2001 | Chen .............................. 330/9 |

* cited by examiner

*Primary Examiner*—Steven J. Mottola
(74) *Attorney, Agent, or Firm*—W. Daniel Swayze, Jr.; W. James Brady; Frederick J. Telecky, Jr.

(57) ABSTRACT

An operational amplifier trim circuit architecture that compensates for fabrication process and temperature drift mismatches reflected to the input as input offset voltage errors without additional temperature compensation circuitry. The operational amplifier includes a first input signal and second input signal applied to an input circuit stage. The input circuit stage amplifies the first input signal differentially with respect to the second input stage and generates a differential current which in turn is applied to a first current path and a second current path. The first current path and second current path have well-matched trim circuits. The first current trim applies a trim current to the first current path, and the second current trim applies a trim current to the second current path. The trim current includes an offset current that is well-matched on both the first current trim path and the second current trim path and, in addition, may have a trim offset current that is present on the first trim current and not on the second trim current or vice versa, depending on the actual mismatch requiring correction on the particular device being trimmed. Thus, since both the first current path and the second current path see identical offset currents that are influenced by temperature variations in the same manner, the input offset voltage of the operational amplifier will have minimum drift over temperature variations.

12 Claims, 4 Drawing Sheets

OPERATIONAL AMPLIFIER TRIM METHOD WITH PROCESS AND TEMPERATURE ERROR COMPENSATION

FIELD OF THE INVENTION

The present invention relates to operational amplifiers and, more particularly, to a precision trimming circuit that provides input offset voltage compensation.

BACKGROUND OF THE INVENTION

An operational amplifier (op amp), which is a basic building block in analog integrated circuits, amplifies the difference between two different potentials. The basic op amp includes a dc amplifier with a differential input and a single-ended output. Ideally, the op amp has a zero output voltage for zero input. However, because of the inherent lack of precision in matching the op amp's two differential input transistors, the op amp may have some output voltage for zero input. The voltage applied to the differential input that will make the output voltage zero is called "input offset voltage."

The magnitude of the input offset voltage can severely limit the applications in which the op amp can be used. The input offset voltage can be canceled by equal and opposite compensating signals. The difficulty with input offset voltage is that it can change with temperature. This change in input offset voltage with temperature is called "thermal drift." Thus, in order to maintain the performance of the op amp within specified criteria, the offset compensation mechanism should be correlated to thermal drift. This problem is especially severe in complementary metal-oxide semiconductor (CMOS) integrated circuits which have well-known consumption and speed benefits. Thus, what is required is to maintain the input offset voltage over the operating temperature range after the device has been trimmed.

SUMMARY OF THE INVENTION

The present invention provides compensation for input offset voltage by balancing the operational amplifier over the operating temperature range after the device has been initially trimmed. The present invention employs a low input offset voltage which remains low over the operating temperature range without a separate temperature compensation circuit. The present invention has a separate trim device for each current path of the circuit to maintain symmetry. Thus, the current paths of the differential circuit have the same leakage current upon temperature excursions. Ideally, the leakage current will occur in both current paths of the differential circuit and maintain circuit balance.

DETAILED DESCRIPTION OF THE PRESENT INVENTION

Figure 1A:
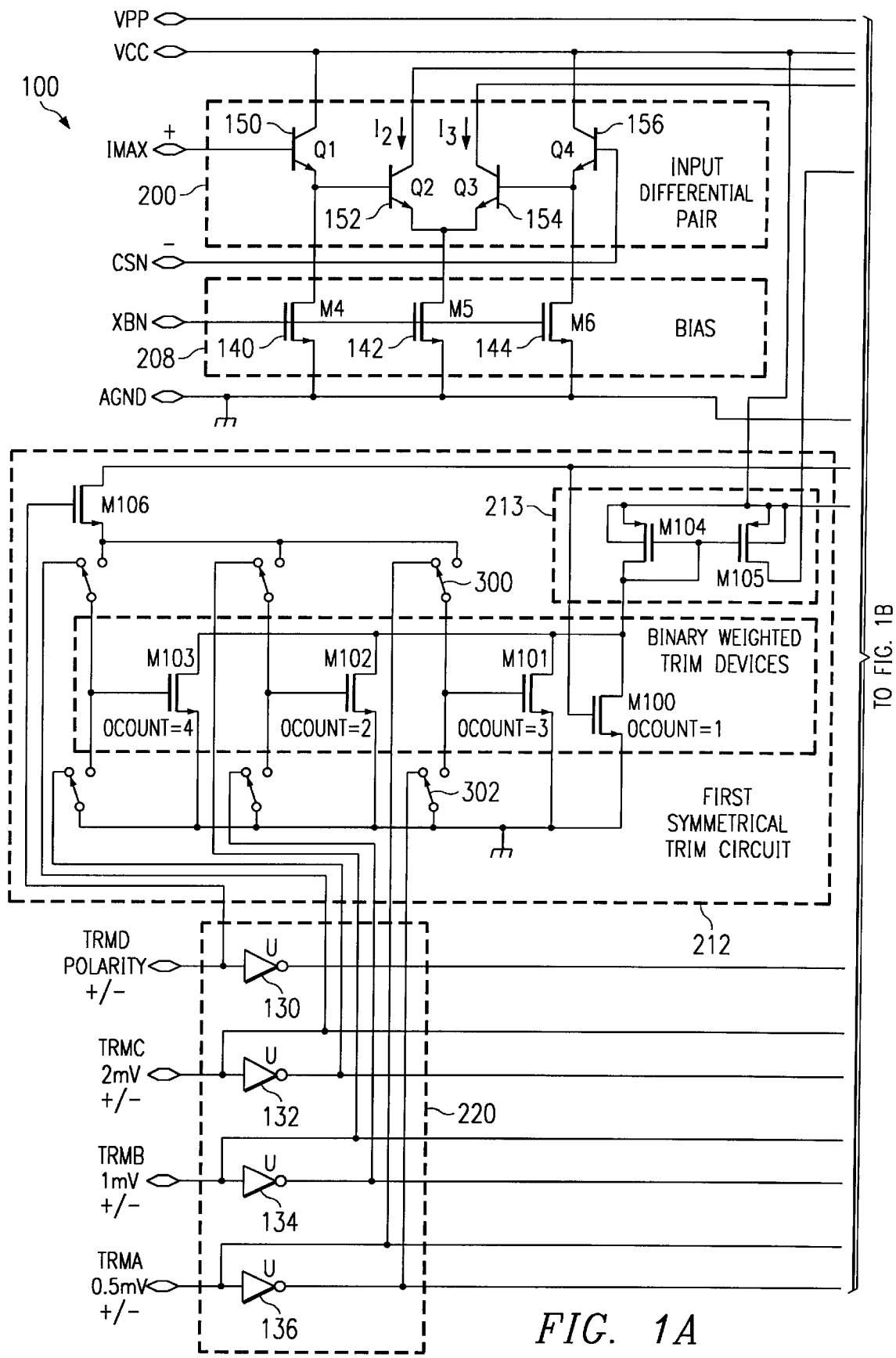
FIG. 1 illustrates an op amp circuit of the present invention.
Figure 1B:
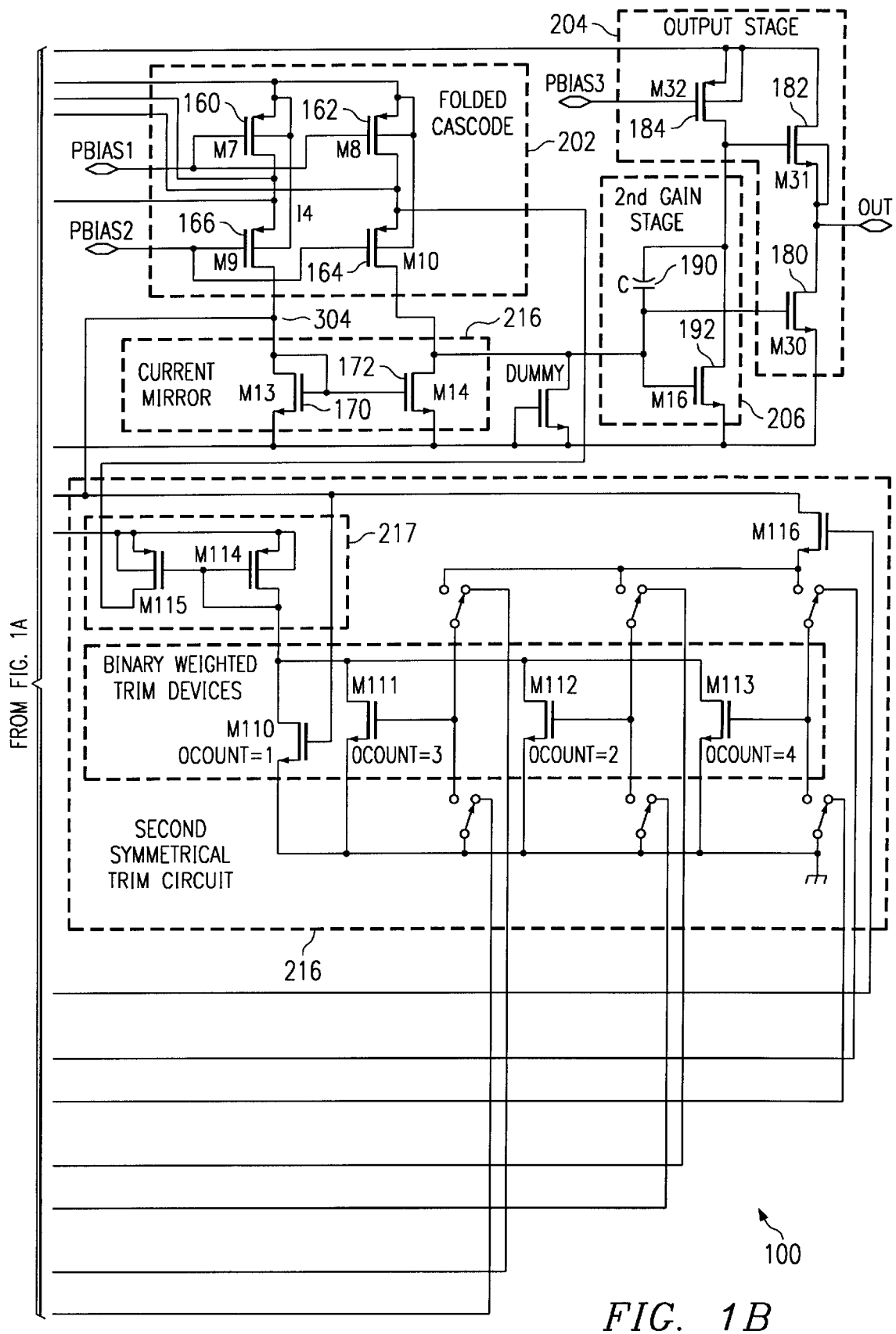

As illustrated in FIG. 1, the op amp circuit 100 includes an input differential pair circuit 200, a folded cascade circuit 202, an output circuit 204, a gain circuit 206, a bias circuit 208, and a current mirror circuit 210. Additionally, the operational amplifier circuit 100 includes a first symmetrical trim circuit 212 and a second symmetrical trim circuit 216. The first and second symmetrical trim circuits 212 and 216 are controlled by control circuit 220. The input differential pair circuit 200 includes an input terminal connected to the base of transistor 150. The collector of transistor 150 is connected to voltage $V_{CC}$. The emitter of transistor 150 is connected to the base of transistor 152. The collector of transistor 152 is connected to folded cascade circuit 202 at the drain of P-channel field effect transistor (PFET) 160. The emitter of transistor 152 is connected to the emitter of transistor 154. The collector of transistor 154 is connected to folded cascade circuit 202 at the drain of PFET transistor 162. The base of transistor 154 is connected to the emitter of transistor 156. The collector of transistor 156 is connected to voltage $V_{CC}$. The base of transistor 156 is connected to another input terminal of the operational amplifier circuit 100.

The bias circuit 208 includes N-channel field effect transistors (NFET), NFET 140, NFET 142, and NFET 144. The drain of transistor 140 is connected to the emitter of transistor 150. The drain of transistor 142 is connected to the emitters of transistors 152 and 154, and the drain of transistor 144 is connected to the emitter of transistor 156. The sources of NFET 140, 142 and 144 are connected to ground. The gates of NFET 140, 142 and 144 are connected to each other and connected to a bias terminal.

The folded cascade circuit 202 includes PFET 160, PFET 162, PFET 164, and PFET 166. The source of PFET 160 and the source of PFET 162 are connected together and connected to voltage $V_{CC}$. PFET 166 and PFET 160 form a first current path through the folded cascade circuit 202 and through the operational amplifier circuit 100. PFET 162 and PFET 164 form a second current path through folded cascade circuit 202 and through the operational amplifier circuit 100. The source of PFET 166 is connected to the drain of PFET 160. Additionally, the source of PFET 164 is connected to the drain of PFET 162. The gate of PFET 160 is connected to the gate of PFET 162 which is connected to a bias terminal, Pbias 1. The gate of PFET 166 is connected to the gate of PFET 164 which is connected to a bias terminal, Pbias 2. The drain of PFET 166 is connected to the drain of NFET 170. The drain of PFET 164 is connected to the drain of NFET 176.

NFET 170 and NFET 176 form a portion of current mirror 210. The gate of NFET 170 and NFET 176 are connected together. The gates of NFET 170 and NFET 176 are connected to the first current path between the drain of NFET 170 and the drain of PFET 166.

The gain stage circuit 206 includes NFET 192 connected to capacitor 190. The source of NFET transistor 192 is connected to ground while the drain is connected to capacitor 190. Additionally, the gate of NFET 192 is connected to capacitor 190 and connected to the gate of NFET 180. The gate of NFET 192 is connected to a terminal between the drain of PFET 164 and the drain of NFET 176.

The output circuit 204 includes PFET 184 having the source connected to voltage $V_{DD}$. The gate of PFET 184 is connected to a bias terminal, Pbias 3. The drain of PFET 184 is connected to the drain of NFET 192. Additionally, the drain of PFET 184 is connected to the gate of NFET 182. The drain of NFET 182 is connected to voltage $V_{DD}$ while the source of NFET 182 is connected to the output terminal of operational amplifier 100 and connected to the drain of NFET 180. The first symmetrical trim circuit 212 includes a current mirror 213 including transistors 104 and 105. The sources of PFET 104 and 105 are connected together and connected to voltage $V_{CC}$. The gate and drain of PFET 104 are connected together with the gate of PFET 105. The drain of PFET 105 is connected to a terminal between the drain of PFET 160 and the source of PFET 166. The second current mirror 217 includes PFET 115 and PFET 114. These are designed and connected in a similar fashion to the first current mirror 213. In addition, the first symmetrical trim circuit 212 includes transistors 103, 102, 101 and 100. These transistors are connected in parallel with switches connected to the gates. These are connected in a similar fashion to NFET 110, 111, 112 and 113 of second symmetrical trim circuit 216.

Turning back to the first symmetrical trim circuit 212, each of these NFET 100, 101, 102 and 103 add a differing amount of trim to the operational amplifier. Each of these transistors, namely NFET 103, 102, 101 and 100, are connected in parallel from drain to source, the drain of each NFET 100, 101, 102 and 103 being connected to the drain and gate of NFET 104 while the source of each NFET 100, 101, 102 and 103 is connected to ground. The gates of NFET 100 and 110 are connected directly to terminal 304 to generate the bias current to turn current mirrors 213 and 217 on and provide a carrier current for the offset current and leakage currents. The gates of NFET 101, 102 and 103 are connected alternately to ground or the source of NFET 106. Each of NFET 101, 102 and 103 are connected similarly, although scaled in a binary fashion to provide progressively larger current trims, and NFET 101 is explained hereafter as an example. Switches 300 and 302 are connected to the gate of NFET 101. Switch 300, when closed, connects the gate of NFET 101 to the source of NFET 106. NFET 106, when turned on, connects the source to drain of NFET 106 to terminal 304. The gate of NFET 106 is connected to receive a polarity signal to control NFET 106. Thus, the polarity signal turns on NFET 106, and if switch 300 is closed, the switch 302 will be open, connecting the gate of transistor 101 to the source of transistor 106. Thus, the gate of transistor 101 will have the same voltage as terminal 304. This allows current that is proportional to the current flowing in NFET 170 to flow through the source to drain of NFET 101. This increased current results in additional current flow through NFET 104. This additional current flow is reflected by the current mirror action to allow more current to flow through NFET 105. This increases the current in the first leg and consequently acts as a trim on this current path. The control circuit 220 includes inverters 130, 132, 134 and 136. Inverter 136 operates such that when switch 300 is closed, switch 302 is open. However, since all of the drains of NFET 100, 101, 102 and 103 are connected to transistor 104, and a small amount of current flows through the respective drain to the substrate, then the small amount of current will also flow from drain to source in NFET 104 and be reflected into the first leg current path. This small amount of current or leakage current is the temperature sensitive aspect of the trim circuit that affects the input offset voltage. The second symmetrical trim circuit 216 operates in a similar fashion. A small amount of current flows through transistors 110, 111, 112 and 113 from drain to substrate regardless of whether or not these transistors are selected to be used for trim. Furthermore, the first symmetrical trim circuit 212 is physically placed on the same integrated circuit and in an extremely close proximity to the second symmetrical trim circuit 216, and during the manufacturing process, corresponding transistors are formed to have the same characteristics. For example, the characteristics of transistor 101 would have the same characteristics as transistor 111. One way to achieve this is to place transistor 101 and transistor 111 on the same integrated circuit in close proximity. Furthermore, the characteristics of transistor 102 are the same as the characteristics of transistor 112. One of these characteristics includes the drain to substrate leakage current, and consequently, when temperature varies and one transistor, for example transistor 101, changes its drain to substrate current, in the corresponding transistor, namely transistor 111 in the second symmetrical trim circuit 216, the characteristics also change by the same magnitude. The remaining drain to substrate current of the other matched transistors are equally changed. As the current of the drain to substrate for transistor 103 changes, the drain to substrate current of transistor 113 changes by the same amount. With respect to transistor 102, when the drain to substrate current changes by the same amount, the drain to substrate current of transistor 112 changes. Thus, the contribution of the drain to substrate current from these transistors are offset by the corresponding trim circuitry, and a balance is achieved between the first current path and the second current path. Change in the drain to substrate current in the first symmetrical trim circuit 212 results in the same change in current magnitude in the second symmetrical trim circuit 216 or vice versa.

Thus, in operation, if the current through transistor 101 (drain to substrate) increases, the current through transistor 104 increases, increasing the current through transistor 105. This increases current into the first current path. Likewise, because of the fact that the drain to substrate current of transistor 110 will equally increase, increasing the current through transistor 114, and correspondingly through transistor 115, this pushes more current into the second current path, maintaining the current balance with respect to temperature. Thus, the circuit passively maintains the offset voltage irrespective of temperature changes.

Figure 2:
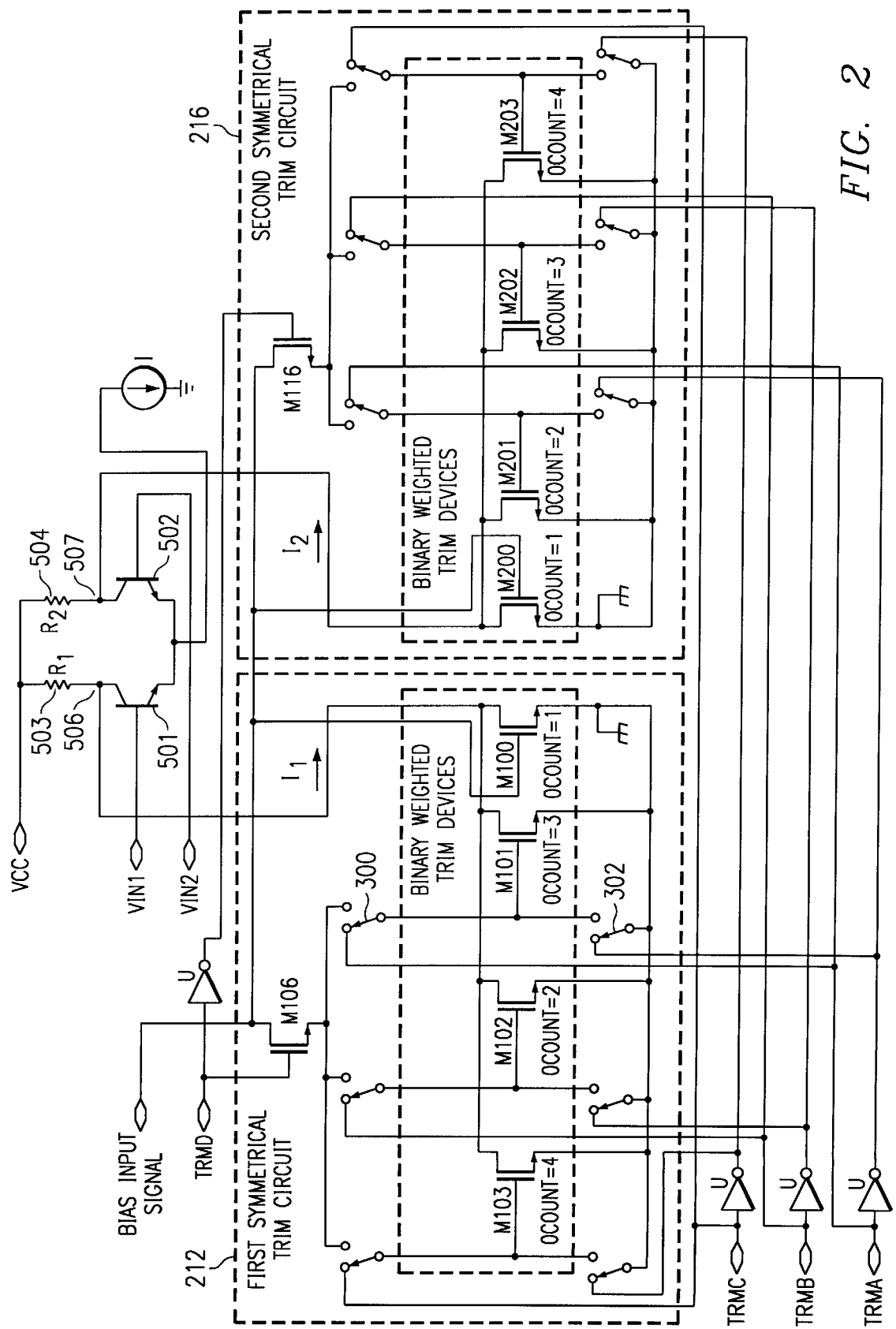
FIG. 2 illustrates a symmetrical differential trimming circuit.

FIG. 2 illustrates symmetrical differential trimming in that trim output currents are in centroid, no offset, condition when trim devices are turned off; an adjustable, from very small to very large, trim current in a positive or negative polarity which can be added by switching on trim devices; and applications that include any differential circuit configuration that may require trimming.

The NPN transistors 501 and 502, as illustrated in FIG. 2, are connected to form a bipolar differential amplifier with resistors 503 and 504 acting as passive loads. The BIAS input signal is used to provide the correct gate-to-source bias voltage for transistors 100–103 and 200–203. Transistors 100 and 200 can be used to provide an "always on" bias current to the differential circuit. Other implementations will not use transistors 100 and 200.

The digital input signals TRMA, TRMB and TRMC control the switches to connect the gates of transistors 101–103 and transistors 201–203 to BIAS input signal via transistor 106 or transistor 116. The polarity of the trim current is controlled by the digital input signal TRMD that is used to drive transistor 106 or transistor 116 and thus turn on the gate drives for the $I_1$ or $I_2$ trim current.

The uncorrected input offset voltage can be measured when TRMA, TRMB and TRMC are off (logic low) and thus no trim is applied to the circuit being trimmed. This is accomplished by connecting the gates of transistors 100–103 and transistors 200–203 to ground.

The input offset voltage can be corrected by applying a trim current to the node input signal at node 506 and node 507. The desired polarity is applied with TRMD; a logic high will connect "BIAS" input signal to the switches connected to transistors 101, 102 and 103, while a logic low will connect "BIAS" input signal to the switches connected to transistors 201, 202 and 203.

The switch 300, controlled by digital input signal TRMA, would be closed, and switch 302, controlled by the inverted digital signal from TRMA, would be open to connect the gate of transistor 101 to "BIAS" input signal and apply the trim current from transistor 101 to the differential pair in node 506.

Figure 3:
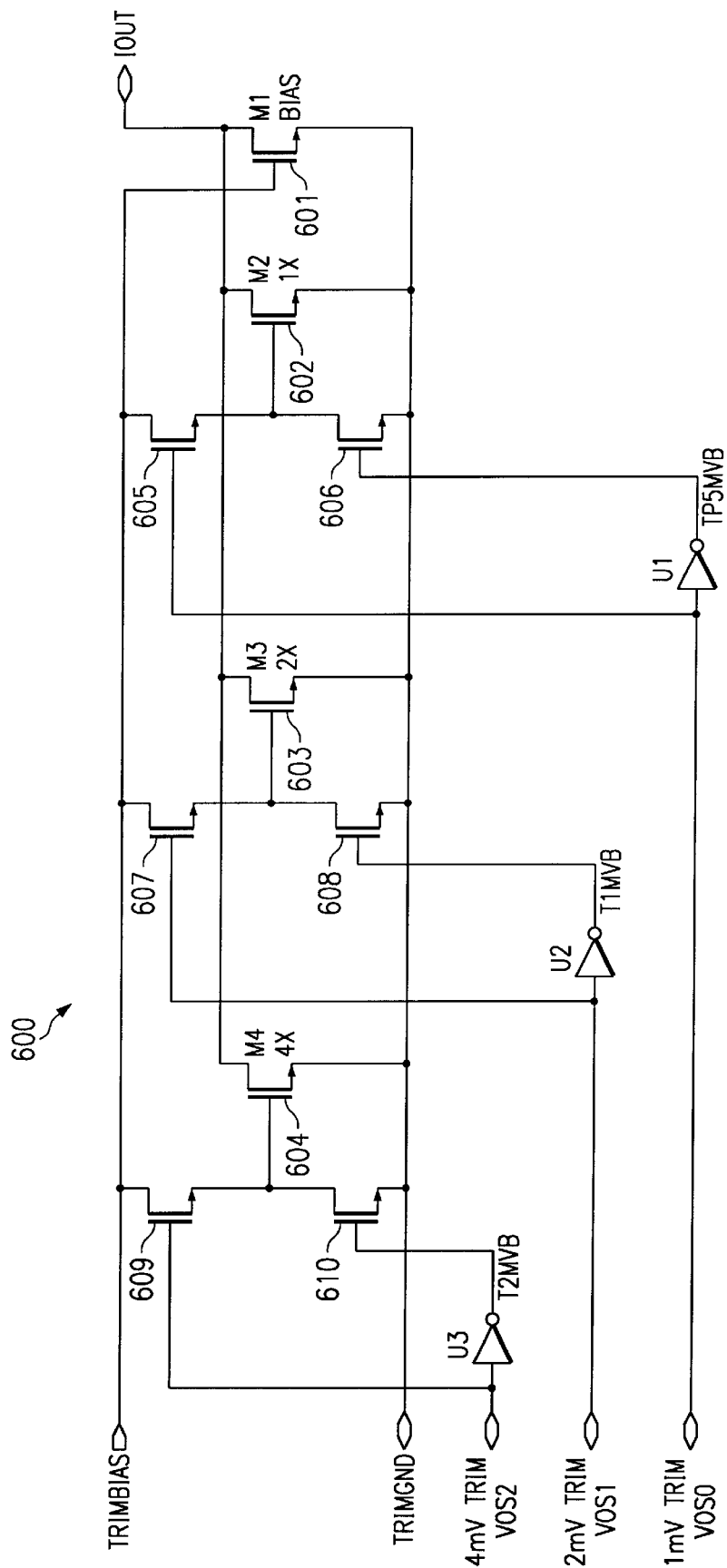
FIG. 3 illustrates a binary weighted trimming circuit.

FIG. 3 illustrates a switched gate binary weighted trim circuit in that transistor 601 can be used to provide bias input signal to output, and transistors 602, 603 and 604 are binary weighted trim devices.

For example:

$I_{602}$=10 $\mu$A when selected $I_{603}$=20 $\mu$A when selected $I_{604}$=40 $\mu$A when selected These transistors could be bipolar devices also. This allows eight combinations of trim outputs:

0 $\mu$A+$I_{BIAS}$ no device selected

10 $\mu$A+$I_{BIAS}$ transistor 602 selected

20 $\mu$A+$I_{BIAS}$ transistor 603 selected

30 $\mu$A+$I_{BIAS}$ transistor 602 and transistor 603 selected

40 $\mu$A+$I_{BIAS}$ transistor 604 selected

50 $\mu$A+$I_{BIAS}$ transistor 604 and transistor 602 selected

60 $\mu$A+$I_{BIAS}$ transistor 604 and transistor 603 selected

70 $\mu$A+$I_{BIAS}$ transistor 604, transistor 603 and transistor 602 selected.

The gates to transistor 602 are switched with digital signals applied to transistors 605 and 606, small transistors are used to control trim stages, and switching is controlled with digital logic.

Applications for this circuit can include all of the previous applications and also be for current mode digital-to-analog converter (DAC).

The switched gate binary weighted trim circuit 600, shown in FIG. 3, provides a circuit to trim a separate circuit using digital signals to select the desired trim current.

The TRIMBIAS input signal is used to provide the correct gate to source bias voltage for transistors 601–604. Transistor 601 can be used to provide an "always on" bias current to the circuit being trimmed and may be eliminated if this feature is not required. Transistors 602, 603 and 604 provide a scaled trim current with transistor 602 having a unit value. Transistor 603, with twice the width, will provide twice as much current as transistor 602, and likewise, transistor 604 will provide four times as much current as transistor 602.

The digital input signals Vos0, Vos1, and Vos2 are used to control the switches that select the trim transistors. For example, a logic low on Vos0 will turn off transistor 605 and will be inverted by inverter U1 to yield a logic high on the gate of transistor 605, thus shorting the gate of transistor 602 to ground and ensuring transistor 602 is effectively off. A logic high on Vos0 will become inverted to a logic low by inverter U1 forcing transistor 606 off. This will also turn transistor 605 on, connecting TRIMBIAS to the gate of transistor 602, thus properly biasing transistor 602 to generate the desired trim current.

An example illustrates the scope of this design. Transistor 602 can be sized with respect to TRIMBIAS to provide an output current that will trim the operating point of an input differential pair by 1 mV. Thus, if Vos0 is a logic high, transistor 602 will be turned on, and Iout will be altered by the equivalent of 1 mV. Transistor 603 can be scaled by a factor of two with respect to transistor 602 and thus provide an output current that will trim the equivalent of 2 mV, and likewise, transistor 604 can provide an output current that will trim the equivalent of 4 mV. This architecture allows for a trim range of 0 mV minimum to 7 mV maximum with a resolution of 1 mV. Thus, a trim equivalent to 5 mV can be obtained by turning transistor 604 and transistor 602 on with a logic high on Vos2 and Vos0, respectively. Those skilled in the art will appreciate that this method can be used for trimming any voltage or current without departing from the spirit or scope of the architecture.

Examples of other usage of the trim circuit of the present invention might be Op Amps with MOS FET inputs, comparator input offset voltage trims, threshold voltage/current trims, timer circuit trims, oscillator circuit trims, analog multiplier offset voltage/current trims, and differential circuit trims.

The operational amplifier trim circuit 100 can be created in various topologies with substitutions, modifications, and additions without departing from the spirit and scope of the invention as defined by the claims.

What is claimed is:

1. An operational amplifier to amplify a first input signal and a second input signal, comprising:

an input circuit to receive a first input signal and a second input signal based on said first input signal;

a first current path having a first current based on said first input signal;

a second current path having a second current based on said second input signal;

a first symmetrical trim circuit connected to trim said first current path; and a second symmetrical trim circuit connected to trim said second current path;

wherein said first current path and said second current path are affected by an offset voltage; and wherein said offset voltage changes the first current and the second current by equal amounts; and wherein said first symmetrical trim circuit is symmetrical to said second symmetrical trim circuit.

2. An operational amplifier as in claim 1, wherein said change to said first current and said second current is passively controlled.

3. An operational amplifier as in claim 2, wherein said control includes FET.

4. An operational amplifier as in claim 3, wherein said passive control includes a first FET to control said first current path and a second FET to control said second current path.

5. An operational amplifier as in claim 4, wherein said first FET and said second FET have similar temperature characteristics.

6. An operational amplifier as in claim 4, wherein said first FET and said second FET are located on the same integrated circuit and positioned in close proximity.

7. An operational amplifier to amplify a first input signal with respect to a second input signal, comprising:

an input circuit to receive a first input signal and a second input signal based on said first input signal;

a differential output current from said first input circuit;

a first current path having a first current based on said differential output current;

a second current path having a second current based on said differential output current;

a first symmetrical trim circuit to apply an offset current to said first current path; and a second symmetrical trim circuit to apply an offset current to said second current path;

wherein said offset current can be trimmed to minimize the operational amplifiers input offset voltage;

wherein said first current path and said second current path are affected by leakage currents;

wherein said leakage currents change the first current and the second current by equal amounts; and wherein said first symmetrical trim circuit is symmetrical to said second symmetrical trim circuit.

8. An operational amplifier as in claim 7, wherein said change to said first current and said second current is passively controlled.

9. An operational amplifier as in claim 8, wherein said control includes FET.

10. An operational amplifier as in claim 9, wherein said control includes a first FET to control said first current path and a second FET to control said second current path.

11. An operational amplifier as in claim 10, wherein said first FET and said second FET have similar temperature characteristics.

12. An operational amplifier as in claim 10, wherein said first FET and said second FET are located on the same integrated circuit and positioned in close proximity.

* * * * *